(12) United States Patent
Lin et al.

(10) Patent No.: US 9,397,643 B1
(45) Date of Patent: Jul. 19, 2016

(54) LINEAR TRIANGULAR WAVE GENERATOR WITH STRAY EFFECT COMPENSATION AND ASSOCIATED METHOD FOR COMPENSATING STRAY EFFECT

(71) Applicant: NATIONAL YUNLIN UNIVERSITY OF SCIENCE AND TECHNOLOGY, Yunlin County (TW)

(72) Inventors: Chun-Wei Lin, Yunlin County (TW); Bao-Yuan Zeng, Yunlin County (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 0 days.

(21) Appl. No.: 14/837,310

(22) Filed: Aug. 27, 2015

(51) Int. Cl.
*H03K 4/06* (2006.01)
*H03K 4/90* (2006.01)
*H03K 3/013* (2006.01)

(52) U.S. Cl.
CPC . *H03K 4/90* (2013.01); *H03K 3/013* (2013.01)

(58) Field of Classification Search
CPC .............. H03K 4/50; H03K 4/06; H03K 4/12
USPC .......................................... 327/131–140, 382
See application file for complete search history.

(56) References Cited

U.S. PATENT DOCUMENTS

| | | | | |
|---|---|---|---|---|
| 5,225,714 A * | 7/1993 | Kimoto | .................... | H03K 4/04 327/133 |
| 5,387,882 A * | 2/1995 | Schoofs | .................... | H03K 4/50 327/131 |
| 8,294,495 B2 * | 10/2012 | Lee | ........................ | H03K 17/56 327/131 |
| 2007/0057707 A1 * | 3/2007 | Uchimoto | ................ | H03K 4/06 327/132 |
| 2010/0039571 A1 * | 2/2010 | Hagino | .................. | H03K 4/502 348/751 |
| 2010/0164563 A1 * | 7/2010 | Bea | ........................ | H02M 3/156 327/132 |
| 2013/0335143 A1 * | 12/2013 | Lee | .......................... | H03K 4/06 330/251 |
| 2015/0188412 A1 * | 7/2015 | Imanaka | ............ | H05B 33/0815 315/200 R |
| 2015/0263714 A1 * | 9/2015 | Yoo | ......................... | H03K 4/08 327/133 |

OTHER PUBLICATIONS

Lin, "Linearity enhancement technique of ramp generator for ADC testing", IEICE Electronics Express, May 10, 2013, vol. 10, No. 9, pp. 1-7.

* cited by examiner

*Primary Examiner* — Lincoln Donovan
*Assistant Examiner* — Thomas Skibinski
(74) *Attorney, Agent, or Firm* — Muncy, Geissler, Olds & Lowe, PC

(57) ABSTRACT

A linear triangular wave generator with stray effect compensation includes a linear triangular wave generating module, a negative impedance converting module, an impedance sensing module and a switch module. The linear triangular wave generator charges/discharges a physical capacitor by a first current source to generate a triangular wave signal, and generates a stray component due to a stray effect. The negative impedance converting module is electrically connected to the linear triangular wave generating module, and includes a negative matching impedance. The switching module is electrically connected to the negative impedance converting module and the impedance sensing module to allow the impedance sensing module to sense an impedance value of the negative matching impedance, so as to calibrate the negative matching impedance and compensate the stray effect to further generate a linear triangular wave signal.

10 Claims, 5 Drawing Sheets

| switch<br>configuration | switching module | switch 1 | switch 2 |
|---|---|---|---|
| 1 | first switching state | on(ON) | off(OFF) |
| 2 | first switching state | off(OFF) | on(ON) |
| 3 | second switching state | on(ON) | off(OFF) |
| 4 | first switching state | off(OFF) | off(OFF) |

Fig. 2A

LINEAR TRIANGULAR WAVE GENERATOR WITH STRAY EFFECT COMPENSATION AND ASSOCIATED METHOD FOR COMPENSATING STRAY EFFECT

FIELD OF THE INVENTION

The present invention relates to a triangular wave generator, and particularly to a linear triangular wave generator with stray effect compensation and an associated method for compensating a stray effect.

BACKGROUND OF THE INVENTION

A common linear ramp generator or triangular wave signal generator charges a capacitor by a constant current source. An output signal of the linear ramp generator or the triangular wave signal generator is then compared with a reference voltage on a comparator, and a signal at an output end of the comparator is obtained to control switching of the current source. However, due to non-ideal manufacturing factors, such as stray effects and offset effects, the linearity of produced signals are affected.

In the prior art, for example, "Linearity enhancement technique of ramp generator for ADC testing" published by Chun Wei Lin on IEICE Electronics Express, discloses a method for eliminating the stray effect. The above disclosure includes a current source, a physical capacitor, a capacitor stray component and a negative impedance converter. Through charging/discharging the physical capacitor by the current source, a signal and a capacitor stray component causing a stray effect are resulted. Further, a negative matching impedance that matches the capacitor stray component is designed in the negative impedance converter to compensate the stray effect.

The negative matching impedance is obtained on a premise that an operational amplifier in the negative impedance converter is in ideal conditions. However, in practical situations, the operational amplifier may be non-ideal, leading to an inaccurate negative matching impedance that fails to match the capacitor stray component in a way that non-linearity in the output signal is caused. Therefore, it is a goal of associated industrialists to provide a solution for further calibrating the negative matching impedance and outputting linear signals.

SUMMARY OF THE INVENTION

It is a primary object of the present invention to provide a solution for overcoming the issue of non-linear output signals caused by an inaccurate negative matching impedance that fails to match a capacitor stray component.

To achieve the above object, the present invention provides a linear triangular wave generator with stray effect compensation. The linear triangular wave generator with stray effect compensation includes a linear triangular wave generating module, a negative impedance converting module, an impedance sensing module and a switching module. The linear triangular wave generating module includes a first current source, and a physical capacitor and a stray component electrically connected to the first current source. The stray component is generated by a stray effect of the first current source and the physical capacitor. The first current source charges/discharges the physical capacitor to generate a linear triangular wave signal. The negative impedance converting module is electrically connected to the linear triangular wave generating module, and includes a negative matching impedance for compensating the impedance of the stray component. The switching module is electrically connected to the negative impedance converting module and the impedance sensing module, and includes a first switching state and a second switching state for switching a sensing configuration of the impedance sensing module, so as to allow the impedance sensing module to sense a matching level between the negative matching impedance and the impedance of the stray component.

To achieve the above object, the present invention further provides a method for compensating a stray effect of a linear triangular wave generator. The method includes following steps.

In step S1, a physical capacitor is charged/discharged by a first current source in a linear triangular wave generating module to generate a triangular wave signal. The linear triangular wave generating module further includes a stray component caused by a stray effect.

In step S2, a negative matching impedance that matches the stray component is designed in a negative impedance converting module.

In step S3, the negative impedance converting module is electrically connected to the first current source and is connected in parallel to the physical capacitor, so as to compensate the impedance of the stray component by the negative matching impedance.

In step S4, a matching level between the negative matching impedance and the impedance of the stray component is sensed by an impedance sensing module.

In step S5, a switching module is electrically connected to the negative impedance converting module and the impedance sensing module. The switching module has a first switching state and a second switching state for switching a sensing configuration of the impedance sensing module, so as to allow the impedance sensing module to sense the matching level between the negative matching impedance and the impedance of the stray component.

In step S6, a value of the negative matching impedance is calibrated according to a sensing result of the impedance sensing module to output a linear triangular wave signal.

It is known from the above description, in the present invention, the stray effect caused by the stray component is compensated by the negative matching impedance in the negative impedance converting module, the matching level between the negative matching impedance and the impedance of the stray component is sensed by the impedance sensing module, and the negative matching impedance is calibrated according to the sensing result of the impedance sensing module, thereby outputting the linear triangular wave signal.

BRIEF DESCRIPTION OF THE DRAWINGS

FIG. 2A shows a method of switching a sensing configuration of an impedance sensing module of the present invention.

DETAILED DESCRIPTION OF THE PREFERRED EMBODIMENTS

Detailed description and technical contents of the present invention are given with the accompanying drawings below.

Figure 1:
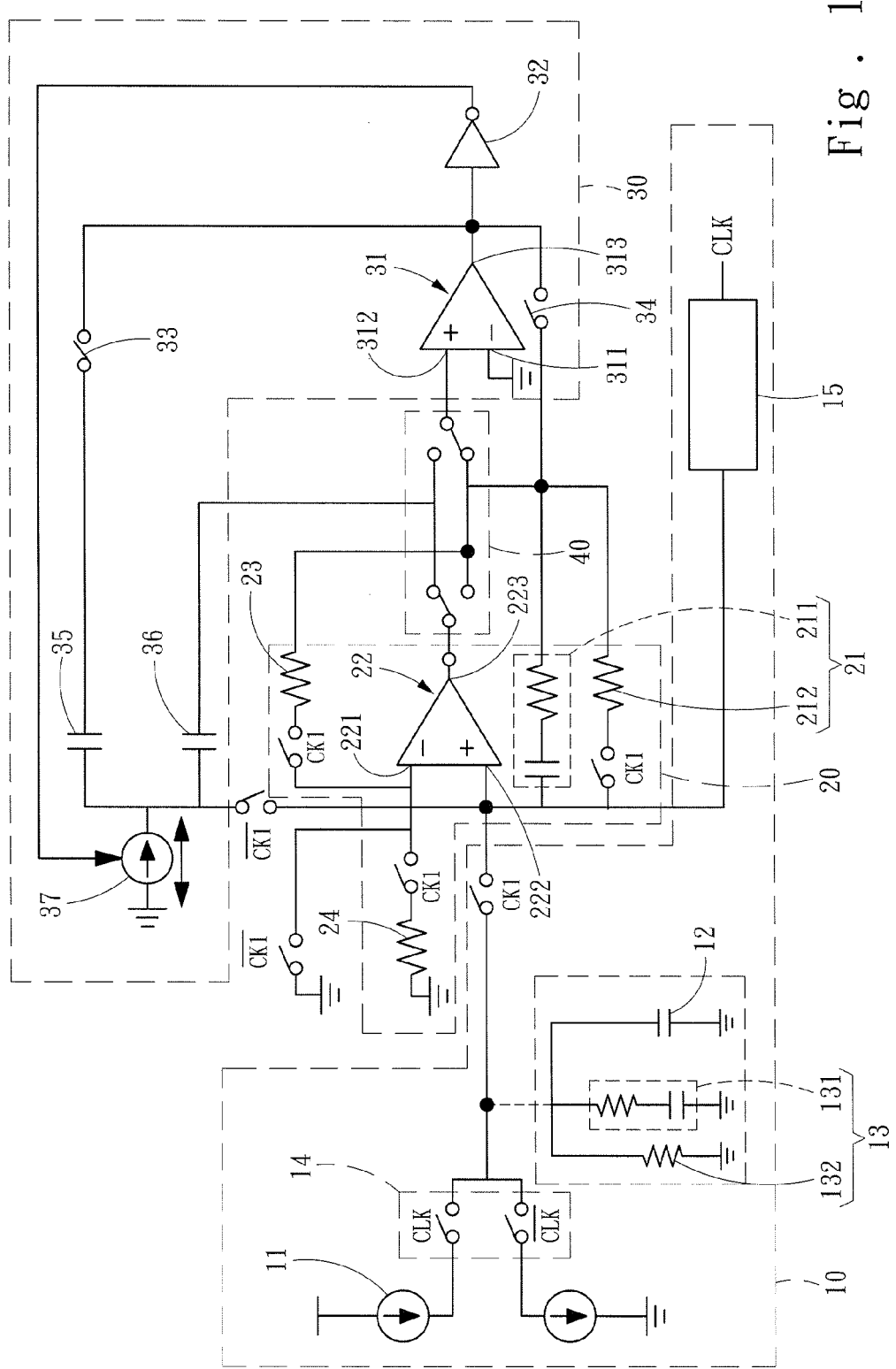
FIG. 1 is a circuit diagram of the present invention.

FIG. 1 shows a circuit diagram of the present invention. The present invention includes a linear triangular wave generating module 10, a negative impedance converting module 20, an impedance sensing module 30 and a switching module 40. The linear triangular wave generating module 10 is electrically connected to the negative impedance converting module 20. The switching module 40 is electrically connected to the negative impedance converting module 20 and the impedance sensing module 30. The linear triangular wave generating module 10 includes a first current source 11, a physical capacitor 12, a stray component 13, a clock switching unit 14 and a window comparing unit 15. The clock switching unit 14 is electrically connected to the first current source 11 and the physical capacitor 12, and controls the first current source 11 to charge/discharge the physical capacitor 12 to output a triangular wave signal. When a switch CLK is turned on and a switch $\overline{CLK}$ is turned off, the physical capacitor 12 is in a charging state. Conversely, when the switch CLK is turned off and the switch $\overline{CLK}$ is turned on, the physical capacitor 12 is in a discharging state. Further, the stray component 13 is formed due to the stray effect of the first current source 11 and the physical capacitor 12, and the stray component 13 includes a capacitor stray component 131 generated due to the physical capacitor 12 and a first current source stray component 132 generated due to the first current source 11. The window comparing unit 15 is electrically connected to first current source 11 and is connected in parallel to the physical capacitor 12. The clock switching unit 14 is controlled according to the window comparing unit 15 to perform charging and discharging operations to further control upper and lower limits the output of the triangular wave signal.

The negative impedance converting module 20 is electrically connected to the linear triangular wave generating module 10, and includes a negative matching impedance 21, a first operational amplifying unit 22, a first resistor 23 and a second resistor 24. The first operational amplifying unit 22 includes a first inverted input end 221, a first non-inverted input end 222 and a first output end 223. The first non-inverted input end 222 is electrically connected to the first current source 11 and is connected in parallel to the physical capacitor 12. The first output end 223 is electrically connected to the switching module 40. The first resistor 23 has its two ends electrically connected to the first inverted input end 221 and the switching module 40, respectively. The second resistor 24 has its two ends electrically connected to the first inverted input end 221 and a ground end, respectively. The negative matching impedance 21 has its two ends electrically connected to the first non-inverted input end 222 and the switching module 40, respectively. By providing the negative matching impedance 21, the impedance of the stray component 13 can be compensated to prevent the stray effect from affecting the circuit. However, in practice, as the first operational amplifying unit 22 is non-ideal, the negative impedance converting module 20 is nonetheless affected by inevitable non-ideal manufacturing factors. To further enhance the accuracy of the negative matching impedance 21 of the negative impedance converting module 20, the impedance sensing module 30 is connected thereto for secondary calibration. The negative matching impedance 21 includes a capacitor negative matching impedance 211 corresponding to the capacitor stray component 131 and a first current source negative matching impedance 212 corresponding to the first current source stray component 132.

The switching module 40 is electrically connected to the negative impedance converting module 20 and the impedance sensing module 30, and has a first switching state and a second switching state for switching the sensing configuration of the impedance sensing module 30, so as to allow the impedance sensing module 30 to sense the matching level between the capacitor negative matching impedance 211 and the impedance of the stray component 13. Further, the impedance sensing module 30 includes a second operational amplifying unit 31, an inverting unit 32, a first switch 33, a second switch 34, a first capacitor 35, a second capacitor 36 and a second current source 37. The second operational amplifying unit 31 includes a second inverted input end 311, a second non-inverted input end 312 and a second output end 313. The second non-inverted input end 312 is electrically connected to the switching module 40. The first switch 33 has its two ends electrically connected to the second output end 313 and the first capacitor 35, respectively. The first capacitor 35 has its one end away from the first switch 33 electrically connected to the first non-inverted input end 222. The second switch 34 has its two ends electrically connected to the negative matching impedance 21 and the second output end 313, respectively. The second capacitor 36 has its two ends electrically connected to the switching module 40 and the first non-inverted input end 222, respectively. The inverting unit 32 is electrically connected to the second output end 313 and the second current source 37, and controls the second current source 37 to perform forward and inverted charging/discharging operations on the impedance sensing module 30. In the embodiment, one second current source 37 is used as an example. In practice, two second current sources 37 may be utilized for charging and discharging, respectively.

When the switching module 40 is switched to the first switching state, the first output end 223 of the first operational amplifying unit 22 and the second non-inverted input end 312 of the second operational amplifying unit 31 are caused to be electrically connected to the second capacitor 36. When the switching module 40 is switched to the second switching state, the first output end 223 of the first operational amplifying unit 22 and the second non-inverted input end 312 of the second operational amplifying unit 31 are caused to electrically connect to the first resistor 23 and the negative matching impedance 21. When $\overline{CK1}$ is turned on and CK1 is turned off, the impedance sensing module 30 senses the matching level between the negative matching impedance 21 and the impedance of the stray component 13. Conversely, when $\overline{CK1}$ is turned off and CK1 is turned on, the impedance of the stray component 13 is compensated.

FIG. 2A to FIG. 2E are a schematic diagram of a control method and circuit diagrams of four sensing configurations of the impedance sensing module 30. When the switching module 40 is switched to the first switching state, the first switch 33 is turned on and the second switch 34 is turned off, a first configuration 50 is formed and a first signal period is generated. When the switching module 40 is switched to the first switching state, the first switch 33 is turned off and the second switch 34 is turned on, a second configuration 51 is formed and a second signal period is generated. When the switching module 40 is switched to the second switching state, the first switch 33 is turned on and the second switch 34 is turned off, a third configuration 52 is formed and a third signal period is generated. When the switching module 40 is switched to the first switching state, and the first switch 33 and the second switch 34 are turned off, a fourth configuration 53 is formed and a fourth signal period is generated. Non-ideal conditions of the first operational amplifying unit 22 are jointly considered through switching the four configurations, and the first signal period, the second signal period, the third signal period and the fourth signal period are analyzed to obtain a result of the matching level between the capacitor negative matching impedance 211 and the impedance of the stray component 13, thereby further calibrating the capacitor negative matching impedance 211. In the embodiment, to reinforce the capability of compensating the stray effect, the capacitor negative matching impedance 211 is adjusted through computer simulations, and so the capacitor negative matching impedance 211 is correspondingly manufactured by a direct internal connection during a manufacturing process. When the capacitor negative matching impedance 211 is directly adjusted, the capacitor negative matching impedance 211 may be implemented in form of an external connection. Thus, by adjusting and replacing the capacitor negative matching impedance 211, a linear triangular wave signal can be outputted.

In the embodiment, the first signal period may be represented as:

$$T_1 = 2\left(\frac{C_1 V_1}{I} + 2t_d\right);$$

the second signal period may be represented as:

$$T_2 = 2\left(\frac{C_x V_1}{I} + 2t_d\right);$$

the third signal period may be represented as:

$$T_3 = 2\left(\frac{C_1 V_1}{I} - 2R_x C_x + 2t_d\right);$$

and the fourth signal period may be represented as: $T_4 = 4t_d$.

In the above, $R_x$ and $C_x$ are impedance values of the capacitor negative matching impedance 211, I is the input current, $C_1$ is the first capacitor 35, $V_1$ is the output voltage of the impedance sensing module 30, and $t_d$ is the delay time of the first operational amplifying unit 22 and the second operational amplifying unit 31.

The first signal period, the second signal period, the third signal period and the fourth signal period are analyzed and calculated to further obtain the impedance value of the capacitor negative matching impedance 211. The impedance values of the capacitor negative matching impedance 211 may be represented as:

$$C_x = C_1\left(\frac{T_2 - T_4}{T_1 - T_4}\right)$$

$$R_x = \frac{1}{4}\left(\frac{T_1 - T_3}{C_x}\right) = \frac{1}{4}\left(\frac{(T_1 - T_3)(T_1 - T_4)}{C_1(T_2 - T_4)}\right)$$

Accordingly, the capacitor negative matching impedance 211 is adjusted and replaced.

Figure 3:
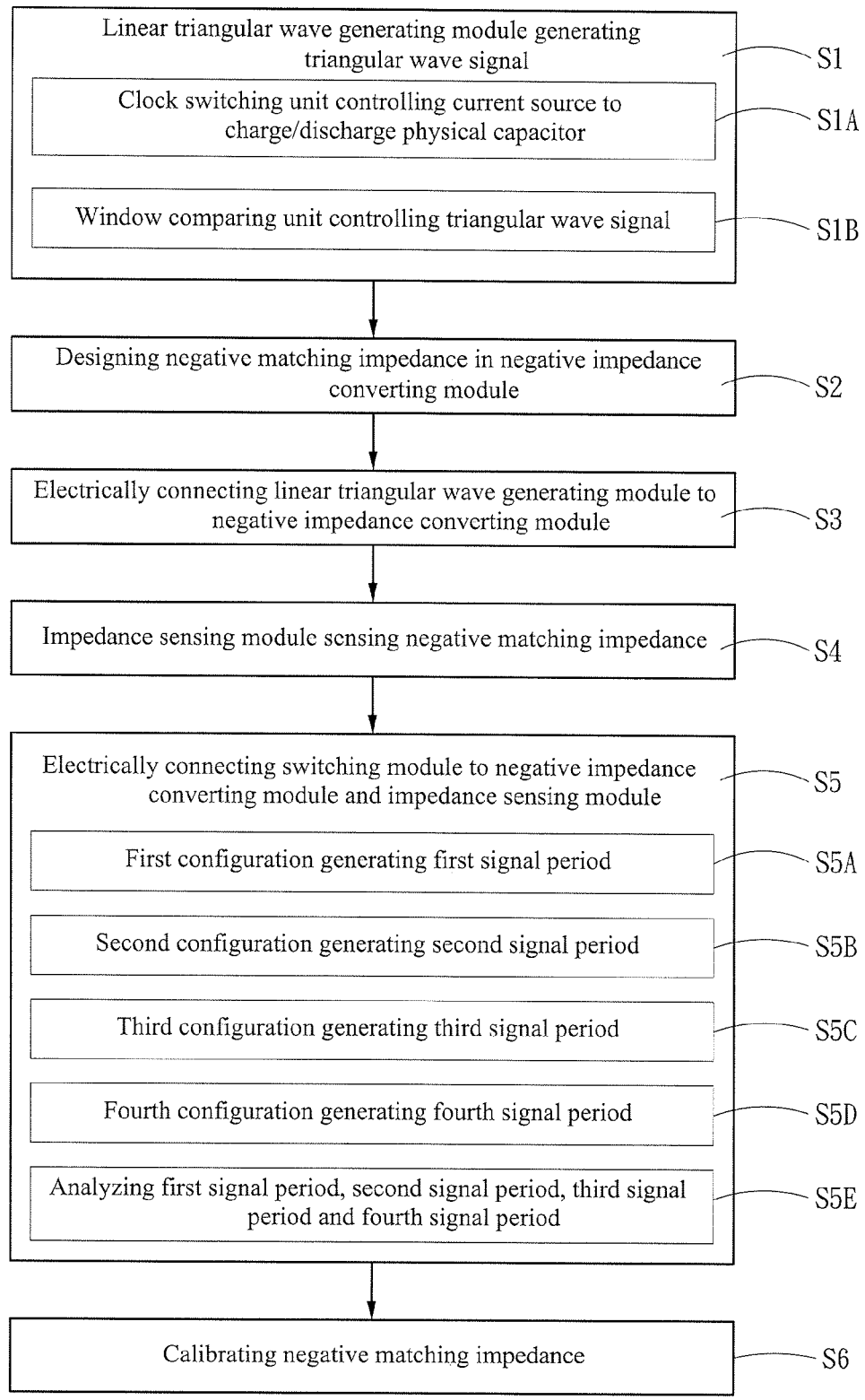
FIG. 3 is a flowchart of an operating method of the present invention.

Again referring to FIG. 3, for further illustration, the present invention further discloses a method for compensating a stray effect. The method includes following steps.

In step S1, a physical capacitor 12 is charged/discharged by a first current source 11 in a linear triangular wave generating module 10 to generate a triangular wave signal. Further, a stray component 13 hence caused by a stray effect. The stray component 13 includes a capacitor stray component 131 generated due to the physical capacitor 12 and a first current source stray component 132 generated due to the first current source 11.

To further illustrate the method according to which the linear triangular wave generating module 10 generates the triangular wave signal, step S1 further includes following steps.

In step S1A, the first current source 11 is controlled by a clock switching unit 14 to charge/discharge the physical capacitor 12. When the switch CLK is turned on and the switch $\overline{CLK}$ is turned off, the physical capacitor 12 is in a charging state. Conversely, when the switch CLK is turned off and the switch $\overline{CLK}$ is turned on, the physical capacitor 12 is in a discharging state to generate the triangular wave signal.

In step S1B, upper and lower limits of an output of the triangular wave signal are controlled by a window comparing unit 15, and the clock switching unit 14 is controlled according to the upper and lower limits of the output to perform charging/discharging operations.

In step S2, a negative matching impedance 21 that matches the stray component 13 is calculated, and the negative matching impedance 21 is electrically connected to a first resistor 23, a second resistor 24 and a first operational amplifying unit 22 to form a negative impedance converting module 20.

In step S3, the negative impedance converting module 20 is electrically connected to the first current source 11 and is connected in parallel to the physical capacitor 12. When the switch CK1 is turned on and the switch $\overline{CK1}$ is turned off, the negative matching impedance 21 compensates the impedance of the stray component 13.

In step S4, a second operational amplifying unit 31, an inverting unit 32, a first switch 33, a second switch 34, a first capacitor 35, a second capacitor 36 and a second current source 37 are electrically connected to form an impedance sensing module 30. The impedance value of the capacitor negative matching impedance 211 is sensed by the impedance sensing module 30.

In step S5, a switching module 40 is electrically connected to the negative impedance converting module 20 and the impedance sensing module 30. The switching module 40 has a first switching state and a second switching state, which operate in conjunction with the first switch 33 and the second switch 34 to switch a sensing mode of the impedance sensing module 30. Thus, the impedance sensing module 30 is allowed to sense the matching level between the capacitor negative matching impedance 211 and the impedance of the capacitor stray component 131.

Step S5 further includes following steps for the sensing operation.

Figure 2C:
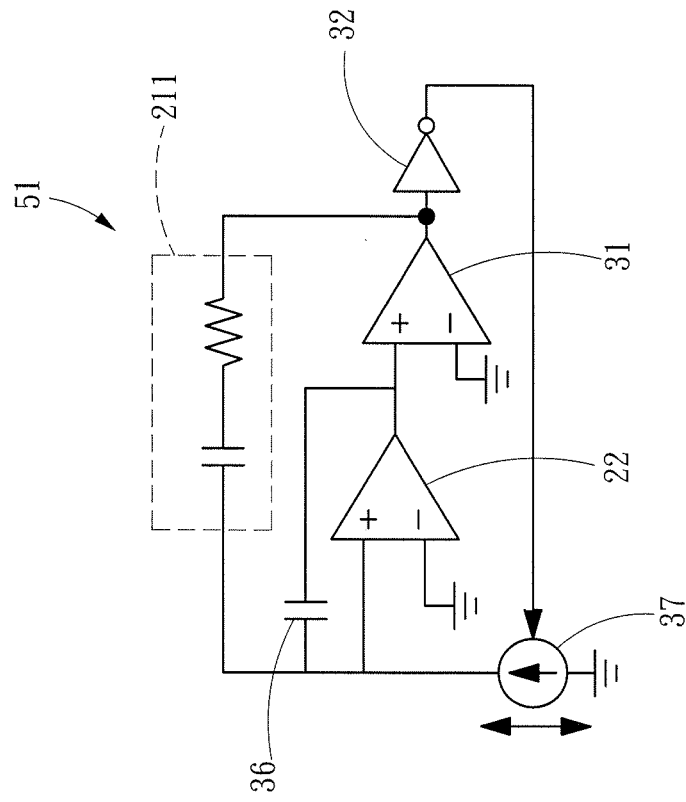
FIG. 2C is a circuit diagram of a second configuration of an impedance sensing module of the present invention.
Figure 2B:
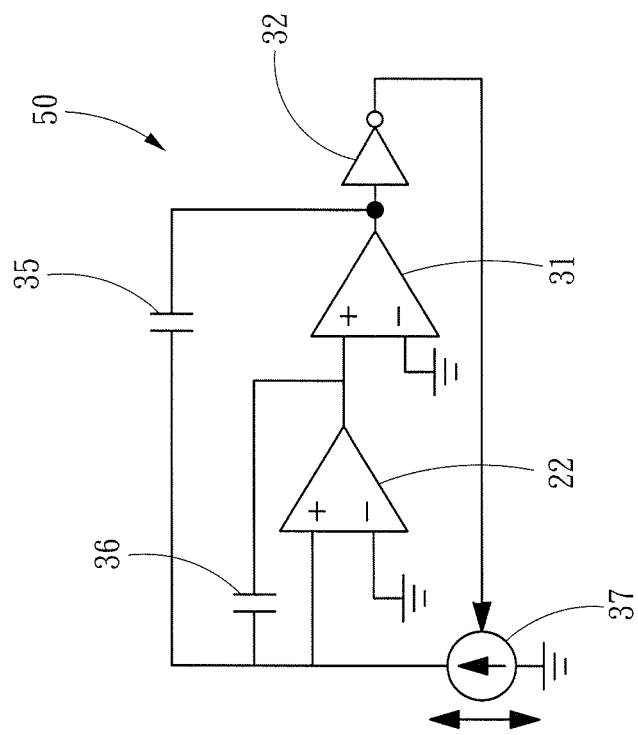
FIG. 2B is a circuit diagram of a first configuration of an impedance sensing module of the present invention.

In step S5A, as shown in FIG. 2B, the switching module 40 is switched to the first switching state, the first switch 33 is turned on and the second switch 34 is turned off, such that the impedance sensing module 30 forms a first configuration 50 and generates a first signal period.

In step S5B, as shown in FIG. 2C, the switching module 40 is switched to the first switching state, the first switch 33 is turned off and the second switch 34 is turned on, such that the impedance sensing module 30 forms a second configuration 51 and generates a second signal period.

Figure 2E:
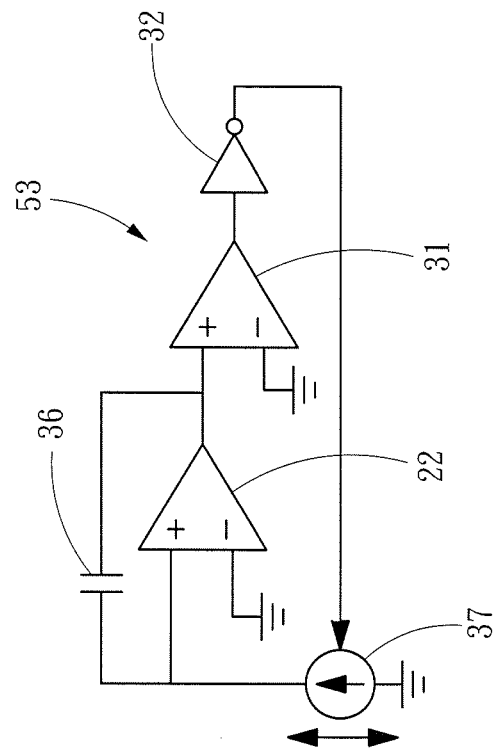
FIG. 2E is a circuit diagram of a fourth configuration of an impedance sensing module of the present invention.
Figure 2D:
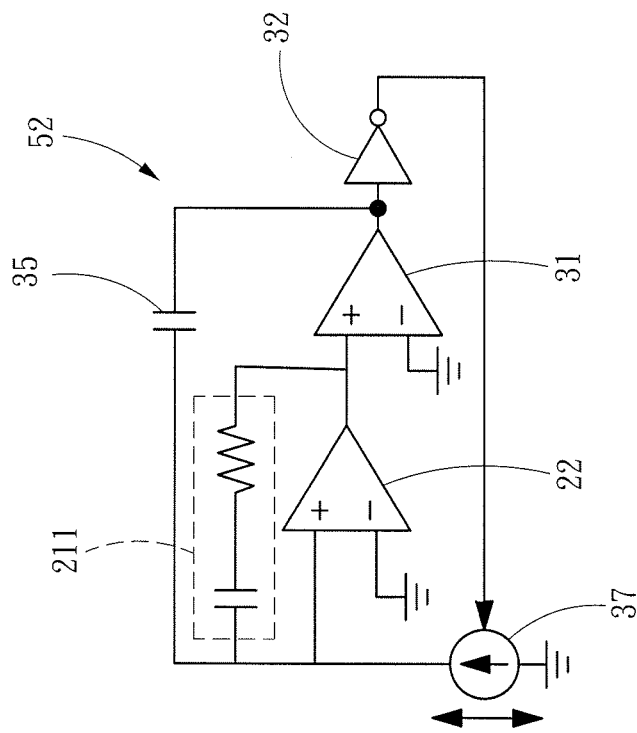
FIG. 2D is a circuit diagram of a third configuration of an impedance sensing module of the present invention.

In step S5C, as shown in FIG. 2D, the switching module 40 is switched to the second switching state, the first switch 33 is turned on and the second switch 34 is turned off, such that the impedance sensing module 30 forms a third configuration 52 and generates a third signal period.

In step S5D, as shown in FIG. 2E, the switching module 40 is switched to the first switching state, and the first switch 33 and the second switch 34 are turned off, such that the impedance sensing module 30 forms a fourth configuration 53 and generates a fourth signal period.

In step S5E, periods of oscillation signals of the first configuration 50, the second configuration 51, the third configuration 52 and the fourth configuration 53 are analyzed to further jointly consider non-ideal conditions of the first operational amplifying circuit, thereby obtaining the result of the matching level between the capacitor negative matching impedance 211 and the impedance of the capacitor stray component 131.

In step S6, the value of the capacitor negative matching impedance 211 is calibrated according to the sensing result of the impedance sensing module 30, and the impedance of the capacitor stray component 131 is compensated to output a linear triangular wave signal.

In conclusion, the present invention provides following advantages.

1. By providing the negative matching impedance, the impedance of the stray component is compensated to output the linear triangular wave signal.

2. Through sensing the negative matching impedance by the impedance sensing module and performing further calibration, the matching level between the negative matching impedance and the impedance of the stray component is enhanced to output a more ideal linear triangular wave signal.

What is claimed is:

1. A linear triangular wave generator with stray effect compensation, comprising:
   a linear triangular wave generating module, comprising a first current source, and a physical capacitor and a stray component electrically connected to the first current source, the stray component being generated due to a stray effect of the first current source and the physical capacitor, the first current source charging/discharging the physical capacitor to generate a linear triangular wave signal;
   a negative impedance converting module, electrically connected to the linear triangular wave generating module, comprising a negative matching impedance for compensating an impedance of the stray component;
   an impedance sensing module, for sensing a matching level between the negative matching impedance and the impedance of the stray component; and
   a switching module, electrically connected to the negative impedance converting module and the impedance sensing module, including a first switching state and a second switching state for switching a sensing configuration of the impedance sensing module for the impedance sensing module to sense the matching level between the negative matching impedance and the impedance of the stray component.

2. The linear triangular wave generator with stray effect compensation of claim 1, wherein the stray component comprises a capacitor stray component and a first current source stray component.

3. The linear triangular wave generator with stray effect compensation of claim 2, wherein the linear triangular wave generating module further comprises a clock switching unit electrically connected the first current source and the physical capacitor, and a window comparing unit electrically connected to the first current source and connected in parallel to the physical capacitor; the clock switching unit controls the first current source to charge/discharge the physical capacitor; the window comparing unit is electrically connected to the physical capacitor to control upper and lower limits of an output of the linear triangular wave signal.

4. The linear triangular wave generator with stray effect compensation of claim 3, wherein the negative impedance converting module further comprises a first operational amplifying unit, a first resistor and a second resistor; the first operational amplifying unit comprises a first inverted input end, a first non-inverted input end and a first output end; the first non-inverted input end is electrically connected to the first current source and is connected in parallel to the physical capacitor; the first output end is electrically connected to the switching module; the first resistor has two ends thereof electrically connected to the first inverted input end and the switching module, respectively; the second resistor has two ends thereof electrically connected to the first inverted input end and a ground end, respectively; the negative matching impedance has two ends thereof electrically connected to the first non-inverted input end and the switching module, respectively.

5. The linear triangular wave generator with stray effect compensation of claim 4, wherein the impedance sensing module comprises a second operational amplifying unit, an inverting unit, a first switch, a second switch, a first capacitor, a second capacitor and a second current source; the second operational amplifying unit comprises a second inverted input end, a second non-inverted input end and a second output end; the second non-inverted input end is electrically connected to the switching module; the first switch has two ends thereof electrically connected to the second output end and the first capacitor, respectively; the first capacitor has one end thereof away from the first switch electrically connected to the first non-inverted input end; the second switch has two ends thereof electrically connected to the negative matching impedance and the second output end, respectively; the second capacitor has two ends thereof electrically connected to the switching module and the first non-inverted input end, respectively; the inverting unit is electrically connected to the second output end and the second current source;
   when the switching module is switched to the first switching state, the first output end of the first operational amplifying unit and the second non-inverted input end of the second operational amplifying unit are caused to be electrically connected to the second capacitor; when the switching module is switched to the second switching state, the first output end of the first operational amplifying unit and the second non-inverted input end of the second operational amplifying unit are caused to be electrically connected to the first resistor and the negative matching impedance.

6. The linear triangular wave generator with stray effect compensation of claim 5, wherein the impedance sensing module performs impedance sensing through four sensing configurations, in a way that a first configuration is formed when the switching module is switched to the first switching state, the first switch is turned on and the second switch is turned off, a second configuration is formed when the switching module is switched to the first switching state, the first switch is turned off and the second switch is turned on, a third configuration is formed when the switching module is switched to the second switching state, the first switch is turned on and the second switch is turned off, and a fourth configuration when the switching module is switched to the first switching state, and the first switch and the second switch are turned off; through switching the four configurations and further jointly considering non-ideal conditions of the first operational amplifying unit, a result of the matching level between the negative matching impedance and the impedance of the stray component is obtained.

7. A method for compensating a stray effect of a linear triangular wave generator, comprising steps of:
- S1: charging/discharging a physical capacitor by a first current source in a linear triangular wave generating module to generate a triangular wave signal, the linear triangular wave generating module comprising a stray component caused by a stray effect;
- S2: designing a negative matching impedance that matches the stray component in a negative impedance converting module;
- S3: electrically connecting the negative impedance converting module to the first current source and parallel to the physical capacitor to compensate an impedance of the stray component by the negative matching impedance;
- S4: sensing a matching level between the negative matching impedance and the impedance of the stray component by an impedance sensing module;
- S5: electrically connecting a switching module to the negative impedance converting module and the impedance sensing module, to allow the impedance sensing module to sense the matching level between the negative matching impedance and the impedance of the stray component; and
- S6: calibrating a value of the negative matching impedance according to a sensing result of the impedance sensing module to output a linear triangular wave signal.

8. The method for compensating a stray effect of a linear triangular wave generator of claim 7, wherein step S1 further comprises steps of:
- S1A: controlling the first current source to charge/discharge the physical capacitor by a clock switching unit to generate the triangular wave signal; and
- S1B: controlling an upper limit and a lower limit of an output of the triangular wave signal by a window comparing unit.

9. The method for compensating a stray effect of a linear triangular wave generator of claim 7, wherein the negative impedance converting module further comprises a first operational amplifying unit, a first resistor and a second resistor; the first operational amplifying unit comprises a first inverted input end, a first non-inverted input end and a first output end; the first non-inverted input end is electrically connected to the first current source and is connected in parallel to the physical capacitor; the first output end is electrically connected to the switching module; the first resistor has two ends thereof electrically connected to the first inverted input end and the switching module, respectively; the second resistor has two ends thereof electrically connected to the first inverted input end and a ground end, respectively; the negative matching impedance has two ends thereof electrically connected to the first non-inverted input end and the switching module, respectively;
the impedance sensing module comprises a second operational amplifying unit, an inverting unit, a first switch, a second switch, a first capacitor, a second capacitor and a second current source; the second operational amplifying unit comprises a second inverted input end, a second non-inverted input end and a second output end; the second non-inverted input end is electrically connected to the switching module; the first switch has two ends thereof electrically connected to the second output end and the first capacitor, respectively; the first capacitor has one end thereof away from the first switch electrically connected to the first non-inverted input end; the second switch has two ends thereof electrically connected to the negative matching impedance and the second output end, respectively; the second capacitor has two ends thereof electrically connected to the switching module and the first non-inverted input end, respectively; the inverting unit is electrically connected to the second output end and the second current source; and
when the switching module is switched to a first switching state, the first output end of the first operational amplifying unit and the second non-inverted input end of the second operational amplifying unit are caused to be electrically connected to the second capacitor; when the switching module is switched to a second switching state, the first output end of the first operational amplifying unit and the second non-inverted input end of the second operational amplifying unit are caused to be electrically connected to the first resistor and the negative matching impedance.

10. The method for compensating a stray effect of a linear triangular wave generator of claim 9, wherein step S5 further comprises steps of:
- S5A: switching the switching module to the first switching state, turning on the first switch and turning off the second switch to cause the impedance sensing module to form a first configuration and to generate a first signal period;
- S5B: switching the switching module to the first switching state, turning off the first switch and turning on the second switch to cause the impedance sensing module to form a second configuration and to generate a second signal period;
- S5C: switching the switching module to the second switching state, turning on the first switch and turning off the second switch to cause the impedance sensing module to form a third configuration and to generate a third signal period;
- S5D: switching the switching module to the first switching state, and turning off the first switch and the second switch to cause the impedance sensing module to form a fourth configuration and to generate a fourth signal period; and
- S5E: analyzing periods of oscillation signals of the first configuration, the second configuration, the third configuration and the fourth configuration to further jointly consider non-ideal conditions of the first operational amplifying unit, thereby obtaining the result of the matching level between the negative matching impedance and the impedance of the stray component.

* * * * *